United States Patent [19]

Ibok

[11] Patent Number: 5,930,658
[45] Date of Patent: Jul. 27, 1999

[54] OXIDIZED OXYGEN-DOPED AMORPHOUS SILICON ULTRATHIN GATE OXIDE STRUCTURES

[75] Inventor: Effiong E. Ibok, Sunnyvale, Calif.

[73] Assignee: Advanced Micro Devices, Inc., Sunnyvale, Calif.

[21] Appl. No.: 08/756,620

[22] Filed: Nov. 26, 1996

[51] Int. Cl.⁶ .................................................. H01L 21/314
[52] U.S. Cl. ........................... 438/482; 438/486; 438/96; 438/966
[58] Field of Search .................... 438/482, 486, 438/96, FOR 261, 966, 968

[56] References Cited

U.S. PATENT DOCUMENTS

| | | | |
|---|---|---|---|
| 4,062,033 | 12/1977 | Suzuki | 257/474 |
| 4,062,034 | 12/1977 | Matsushita et al. | 438/918 |
| 4,080,619 | 3/1978 | Suzuki | 257/591 |
| 4,339,285 | 7/1982 | Pankove | 148/1.5 |
| 4,344,985 | 8/1982 | Goodman et al. | 438/763 |
| 4,349,408 | 9/1982 | Tarng et al. | 438/909 |
| 4,420,765 | 12/1983 | Tarng | 257/636 |
| 4,695,479 | 9/1987 | Nakakura et al. | 438/703 |
| 5,403,772 | 4/1995 | Zhang et al. | 438/96 |
| 5,576,222 | 11/1996 | Arai et al. | 437/4 |

FOREIGN PATENT DOCUMENTS

| | | |
|---|---|---|
| 0 035 146 A2 | 2/1981 | European Pat. Off. . |
| 01014968 | 1/1989 | Japan . |
| 02184076 | 7/1990 | Japan . |
| 07122751 | 5/1995 | Japan . |
| 08055846 | 2/1996 | Japan . |

OTHER PUBLICATIONS

Tunnel Oxide Prepared by Thermal Oxidation of Thin Polysilicon Film on Silicon (TOPS), Shye Lin Wu, IEEE Device Letters 14 (1993) Aug., No. 8, New York.

*Primary Examiner*—Chandra Chaudhari
*Assistant Examiner*—Thanh T. Nguyen
*Attorney, Agent, or Firm*—H. Donald Nelson

[57] ABSTRACT

A method of manufacturing a semiconductor device to negate the effects on the device performance caused by defects on the silicon substrate. An oxygen doped amorphous silicon layer is deposited onto the gate region of the semiconductor device and can have a thickness of less than 5 nanometers. The amorphous silicon provides a conformal layer over the defects on the silicon substrate. The oxygen doping of the amorphous silicon maintains the conformality of the amorphous silicon layer during subsequent processing by preventing the formation of large amorphous silicon grains during a crystallization process. The resulting silicon oxide layer has increased uniformity and can have a thickness of less than 10 nanometers.

4 Claims, 6 Drawing Sheets

OXIDIZED OXYGEN-DOPED AMORPHOUS SILICON ULTRATHIN GATE OXIDE STRUCTURES

BACKGROUND OF THE INVENTION

1. Field of the Invention

This invention relates generally to the manufacture of high performance semiconductor devices and, more particularly, to the manufacture of high performance submicron semiconductor devices and, even more particularly, to a method for the manufacture of high performance submicron semiconductor devices having ultrathin gate oxide structures in which anomalies on the interface surface between the gate oxide and the silicon substrate are negated.

2. Discussion of the Related Art

The semiconductor industry is characterized by the dual requirements of an increase in the speed of integrated circuits and an increase in the density of elements in integrated circuits. Thus, these two requirements have become the two major goals of MOSFET scaling. Increasing the density of elements means, primarily, that smaller channel lengths and widths are necessary. Increasing the speed of integrated circuits means, primarily, that the MOSFET saturation drain current $I_{DSAT}$ must be increased to allow faster charging and discharging of parasitic capacitances. Existing performance models for MOSFETs predicted that a decrease in either the channel length, L, or the gate oxide thickness, $t_{ox}$, would increase $I_{DSAT}$. However, as devices were scaled below approximately 2 µm, "short-channel" effects were observed that were not predicted by the existing performance models which were then referred to as "long channel" models. For example, one of the short channel effects that was not predicted by the long channel model was that $I_{DSAT}$ becomes independent of channel length in extremely small MOSFETs and approaches a constant value regardless of any decrease in the channel length. It was also found that decreasing the gate oxide thickness, $t_{ox}$, provided a much greater increase in $I_{DSAT}$ than a concomitant decrease in channel length, L. However, a thinner gate oxide thickness, $t_{ox}$, will cause $I_{DSAT}$ to increase faster to the constant value as the channel length, L, is decreased. Therefore, decreasing the gate thickness, $t_{ox}$, results in an increase in $I_{DSAT}$ in two ways and, therefore, it was determined that it is more advantageous to concentrate on methods to decrease gate oxide thickness rather than on methods to decrease channel length.

As device dimensions continued to decrease, it was determined that other short-channel effects needed to be addressed. All of the short-channel effects were placed into the following two general categories: (1) the problem of increased leakage current when the MOSFET is off and (2) the reliability problems associated with short-channel and thin gate oxide device structures.

The reliability problems that arise in short-channel and thin gate oxide MOSFETs include: (1) thin gate oxide breakdown; (2) device degradation due to hot-carrier effects; and (3) reliability problems associated with interconnects between MOSFETS. The problems that are of interest are the phenomena of thin gate oxide breakdown and the phenomena of device degradation due to defects or faults at the silicon substrate-gate oxide (Si—SiO$_2$) interface.

The characteristics of the Si—SiO$_2$ interface in a MOSFET determine, to a significant extent, the functioning of the gate dielectric. A study of the structure of the silicon substrate-gate oxide interface has resulted in the identification of various types of defects or faults that exist at the interface. FIG. 7 illustrates three types of anomalies that are typically found on the surface 700 of a silicon substrate 100. A first type of anomaly on the surface 700 is shown at 702 and represents a dislocation in the crystal structure of the silicon substrate 100. A second type of anomaly on the surface 700 is shown at 704 and represents a particle of a contaminant material on the surface 700. A third type of anomaly on the surface 700 is shown at 706 and is shown as a pit or cavity in the surface 700. The effects of these defects have become more apparent and more critical as the thickness of the gate oxide has been scaled concomitantly with the decrease of device dimensions into the submicron regime.

SUMMARY OF THE INVENTION

The present invention is directed to a method of manufacturing a semiconductor device in which an oxygen doped amorphous silicon layer is deposited onto the gate region of the semiconductor device.

The oxygen doped amorphous silicon is obtained by injecting an oxygen containing gas into a silicon containing stream directed at the surface of the silicon substrate material.

The concentration of the oxygen injected into the silicon containing stream is on the order of parts per thousand.

The concentration of the oxygen injected into the silicon containing stream is set to avoid the formation of silicon oxide during the deposition of the amorphous silicon.

The layer of amorphous silicon in one embodiment has a thickness of less than 5 nanometers and is oxidized to form a layer of silicon oxide having a thickness of less than 10 nanometers.

The present invention is directed to a semiconductor device having a gate oxide region formed from a layer of oxygen doped amorphous silicon.

The layer of silicon oxide, in one embodiment, is less than 10 nanometers and is formed from a layer of amorphous silicon having a thickness of less than 5 nanometers.

The present invention is better understood upon consideration of the detailed description below, in conjunction with the accompanying drawings. As will become readily apparent to those skilled in this art from the following description there is shown and described a preferred embodiment of this invention simply by way of illustration of the mode best suited to carry out the invention. As it will be realized, the invention is capable of other different embodiments, and its several details are capable of modifications in various, obvious aspects all without departing from the scope of the invention. Accordingly, the drawings and descriptions will be regarded as illustrative in nature and not as restrictive.

BRIEF DESCRIPTION OF THE DRAWINGS

The accompanying drawings incorporated in and forming a part of the specification, illustrate the present invention, and together with the description serve to explain the principles of the invention. In the drawings.

DETAILED DESCRIPTION

Figure 1:
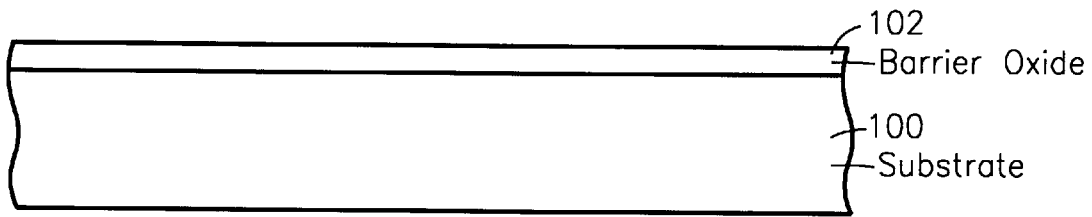
FIG. 1 shows a substrate material with a barrier oxide layer formed on the substrate material.

Referring to FIGS. 1–6, the basic initial steps in the conventional method of manufacturing a MOSFET device are illustrated. FIG. 1 shows a silicon substrate 100 with a barrier oxide layer 102 formed on the silicon substrate 100. The method of forming the barrier oxide layer 102 is well known in the art and will not be discussed. As is known in the art, the primary purpose of the barrier oxide layer 102 is to protect the silicon substrate 100 from contamination during subsequent manufacturing processes.

Figure 2:
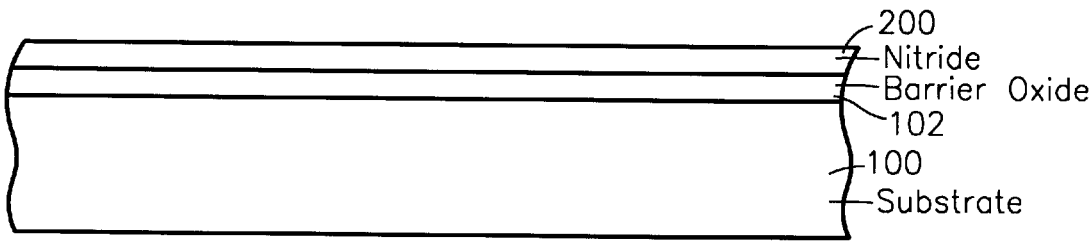
FIG. 2 shows a nitride layer formed on the oxide layer shown in FIG. 1.

FIG. 2 shows a nitride layer 200 formed on the barrier oxide layer 102. In this and subsequent figures, like numeral designations will be used to indicate like elements. The formation of the nitride layer 200 is also well known in the art and will not be discussed.

Figure 3:
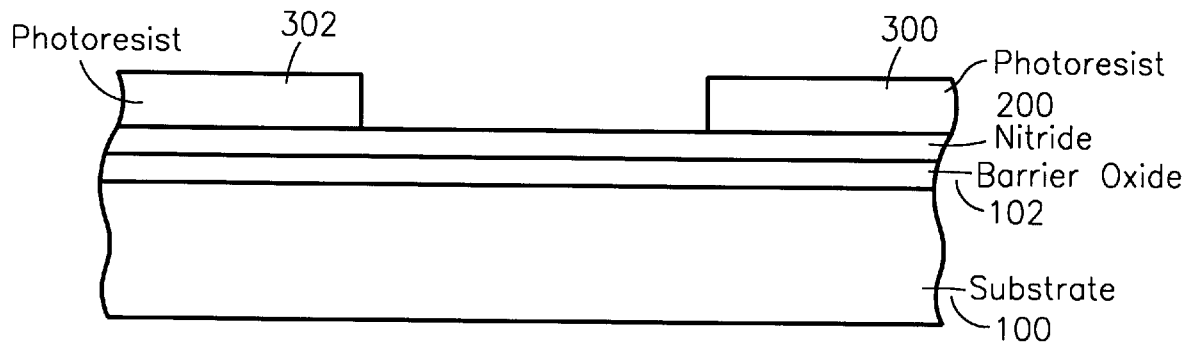
FIG. 3 shows a photoresist pattern formed on the nitride layer shown in FIG. 2.
Figure 4:
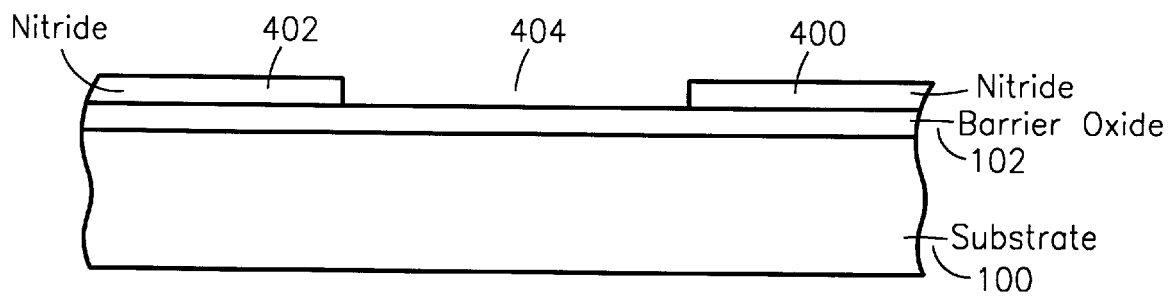
FIG. 4 shows the photoresist removed after the nitride layer has been selectively removed.

FIG. 3 shows a photoresist pattern, represented by photoresist layer portions 300 and 302, that is formed on the nitride layer 200. The photoresist pattern allows portions of the nitride layer 200 to be removed as is shown in FIG. 4. This specific photoresist pattern is known as the source/drain mask step and defines the locations at which the source and drain of the MOSFET will be formed in subsequent processes.

FIG. 4 shows the structure shown in FIG. 3 with the photoresist layer portions 300 and 302 removed. It is noted that the portions of the nitride layer 200 that were under the photoresist layer portions 300 and 302 (FIG. 3) are still present, indicated at 400 and 402, and that the portion of the nitride layer 200 that was not protected by the photoresist layer portions 300 and 302 has been removed. The removed portion is indicated at 404 between the remaining portions of the nitride layer 400 and 402.

Figure 5:
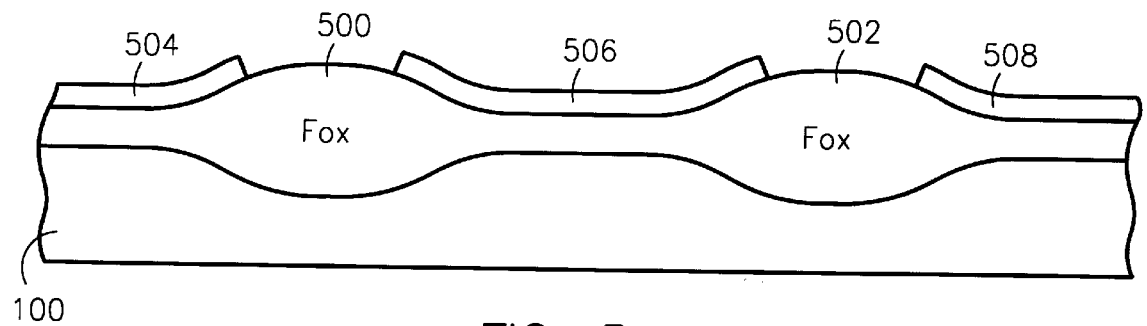
FIG. 5 shows the growth of field oxide (FOX) regions.

FIG. 5 shows regions of field oxide (FOX), indicated at 500 and 502. Also shown are portions of the nitride layer, indicated at 504, 506, and 508, that remain on the structure. It is noted that for clarity and explanation purposes, more of the structure is shown in FIG. 5 than is shown in FIG. 4. It is also noted that the field oxide regions, 502 and 504, grow and expand in such a way that the ends of the nitride regions 504, 506, and 508 are elevated.

Figure 6:
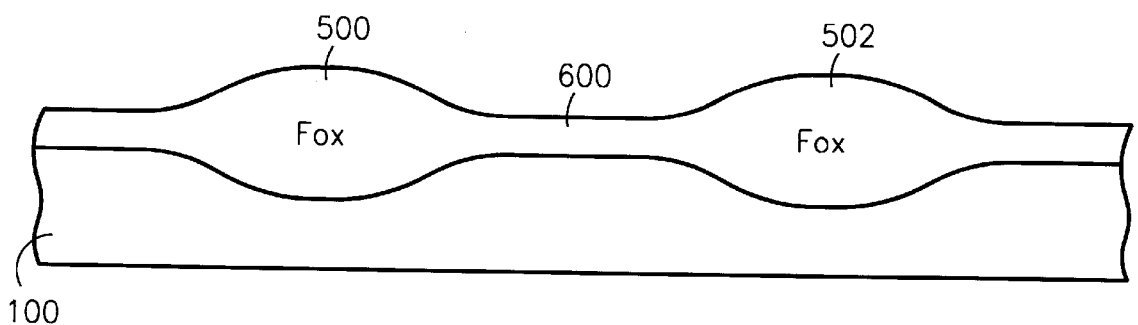
FIG. 6 shows the nitride layer removed after the field oxide regions have been grown.

FIG. 6 shows the structure as shown in FIG. 5 with the portions of the nitride layer removed, leaving only the substrate 100 and the two field oxide regions 502 and 504. The field oxide regions are shown connected by the oxide region 600. However, the oxide region 600 is removed leaving the field oxide regions 502 and 504 with a portion of the surface of the silicon substrate 100 between them as will be discussed in conjunction with FIG. 7.

Figure 7:
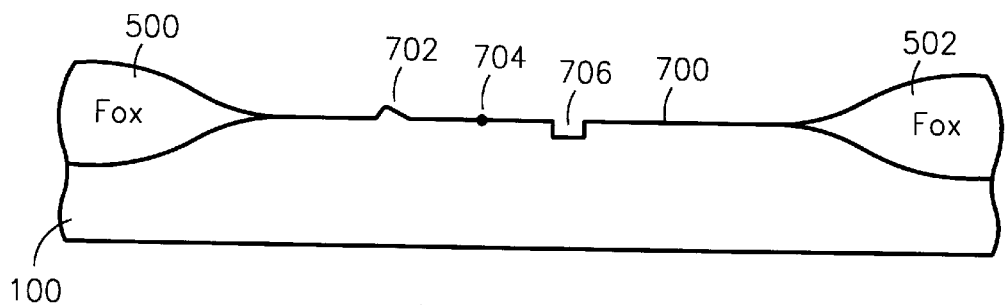
FIG. 7 shows the surface of the silicon substrate that will form the interface between the silicon substrate and the gate oxide and showing three types of anomalies that are typically found on the surface of the interface.

FIG. 7 shows a portion of the surface, indicated at 700, of the silicon substrate 100. For explanation and clarity purposes, the field oxide regions 500 and 502 are shown spread apart in relation to their representation in FIG. 6. A first type of anomaly on the surface 700 is shown at 702 and represents a dislocation in the crystal structure of the silicon substrate 100. A second type of anomaly on the surface 700 is shown at 704 and represents a particle of a contaminant material on the surface 700. A third type of anomaly on the surface 700 is shown at 706 and is shown as a pit or cavity in the surface 700. These anomalies are present in prior art devices, however, because the dimensions of the prior art devices are large enough to mask the anomalies, the prior art has not developed effective methods for dealing with these anomalies. As a result, the effects of these anomalies on the performance of the MOSFET devices have become more apparent and more critical as the thickness of the gate oxide has decreased. The primary effect of not having a method for dealing with the anomalies is that the yield of good devices continued to decrease as the device dimensions continued to decrease.

Figure 8:
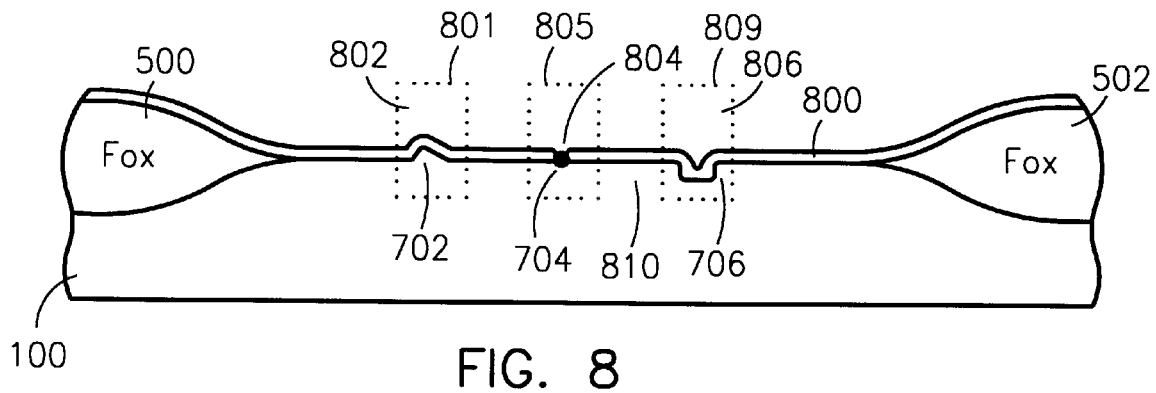
FIG. 8 shows the surface of the silicon substrate shown in FIG. 7 with an ultrathin gate oxide formed thereon and showing the effects of various faults or defects on the surface of the silicon substrate.

FIG. 8 illustrates the effects that the three types of anomalies indicated in FIG. 7 will have on the device using a conventional manufacturing process primarily used in prior art processes. In a typical conventional manufacturing process, a layer of silicon oxide, indicated at 800, is grown on the surface 700 of the silicon substrate 100. As is known in the semiconductor processing art, an oxide will grow on any part of a semiconductor structure that has an exposed oxidizable surface (such as silicon). One method to prevent a part of the structure from forming a layer of silicon oxide or any other oxide is by forming a layer of nitride over the portion of the structure to be protected.

Figure 8A:
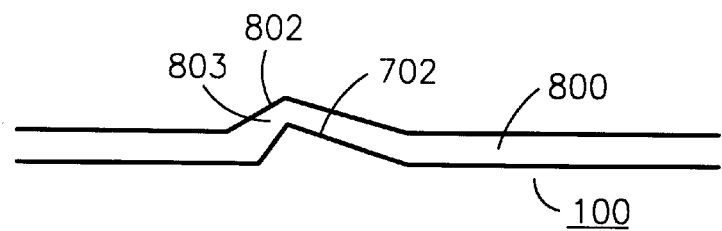
FIG. 8A shows an enlarged view of the first type of anomaly shown in FIG. 8.

As shown in FIG. 8, there are various effects on the formed silicon oxide caused by the three types of anomalies. The portion of the oxide, indicated at 802, that is grown over the first type of anomaly 702, is silicon oxide, however, the silicon oxide grown over such an anomaly is relatively thin in relation to the remainder of the layer of silicon oxide. The portion of the surface 700 within dashed line 801 is shown enlarged in FIG. 8A. One of the reasons for the thinness of the layer grown over such an anomaly, is that the anomaly 702, indicated at 802, is primarily caused by a dislocation in the crystal lattice and, as a result, there may not be sufficient free silicon atom bonds available, or in the appropriate orientation, to which oxygen atoms can bond in sufficient numbers to form the required thickness. The resulting thin portions 803 that form at 802 cause stress in the finished MOSFET when subjected to an electric field or current. The electrical stress will cause a rapid degradation in the performance of the MOSFET, up to and including failure of the MOSFET. As can be appreciated, this effect is more apparent and critical as the thickness of the gate oxide is decreased and as the thickness of the oxide layer grown over such an anomaly becomes even more thin.

Figure 8B:
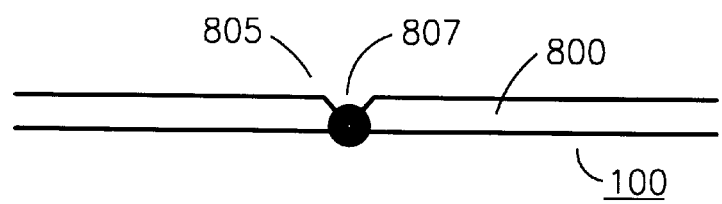
FIG. 8B shows an enlarged view of the second type of anomaly shown in FIG. 8.

The second type of anomaly shown at 704 in FIG. 8 is typically a contaminant particle. When these particles are large enough, silicon oxide will not be able to grow over them since silicon oxide cannot be grown over a non-silicon contaminant particle. As indicated in FIG. 8, at 804, there will then be a portion of the gate oxide that will not have an oxide layer. FIG. 8B is an enlarged view of the second type of anomaly shown at 804 inside dashed line 805. The contaminant particle 807 will cause a discontinuity in the silicon oxide layer. This will likely cause the device to be immediately rejected thus causing the manufacturing yield to be lowered. A lower manufacturing yield, in turn, causes the overall cost of the remaining devices to increase.

Figure 8C:
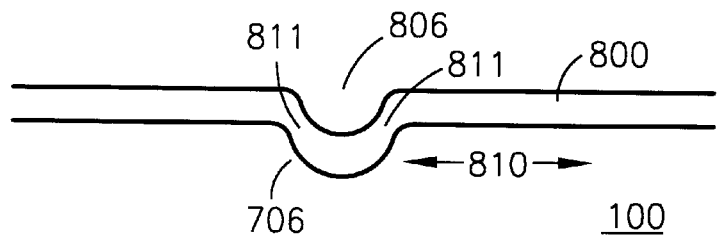
FIG. 8C shows an enlarged view of the third type[e of anomaly shown in FIG. 8.

The third type of anomaly shown at 706 is a shallow pit or crevice in the surface 700 of the silicon substrate 100. The effects of this type of defect have not been quantified or qualified and this type of defect may result in different types of degradation depending upon how the silicon oxide layer forms over the pit. The growth of the silicon oxide layer over the pit 706 is indicated at 806. FIG. 8C is an enlarged view of the portion of the surface 700 within dashed line 809. As can be appreciated by one of ordinary skill in the art, the silicon oxide layer 800 can grow in various ways because there are side surfaces and bottom surfaces in the pit 706 that cause anomalies in growth of the silicon oxide layer. These anomalies also cause stress in the gate oxide when an electric field is applied to the gate or when a current is caused to flow in the tunnel region, indicated at 810, which is in the silicon substrate 100 under the gate. Another result that is probable is that the pit 706 will be replicated in the surface of the silicon oxide layer 800 indicated at 806. Another effect that occurs is that the silicon oxide layer 800 will have thin portions, indicated at 811. One such mode of failure associated with a pit in the surface 700 is that the pit 706 can be the site of a rupture which will cause a propagating crack in the material when the device is subjected to temperature cycling. This increased potential for cracking in the gate material causes the MOSFET to be susceptible to failures up to and including catastrophic failures.

Figure 9:
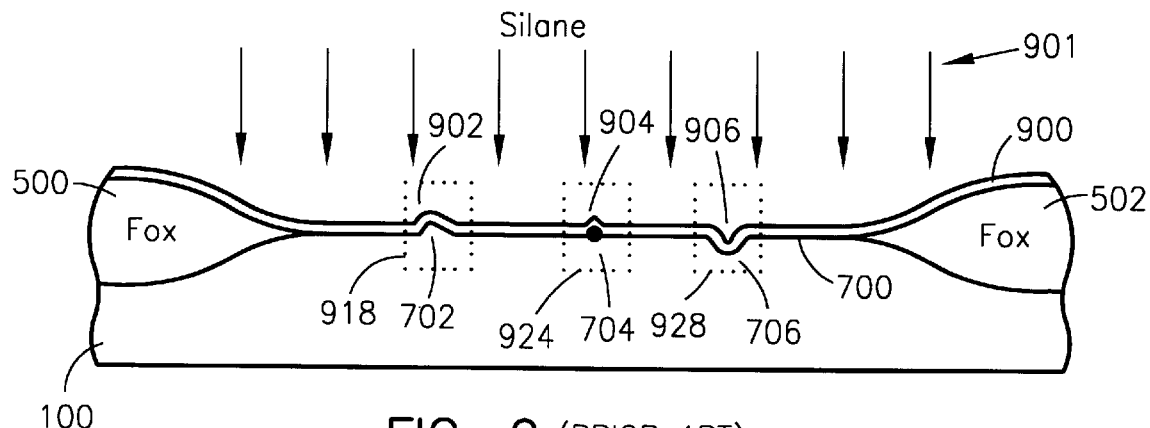
FIG. 9 shows the surface of the silicon substrate shown in FIG. 7 having an amorphous silicon layer formed on the surface of the silicon substrate over the anomalies on the surface of the silicon substrate in accordance with the prior art.

FIG. 9 illustrates a prior art attempt to negate the effects of the three types of anomalies shown in FIG. 7 and discussed above in conjunction with FIGS. 8–8C. This attempt is to deposit a layer of amorphous silicon, indicated at 900 on the surface 700 of the silicon substrate 100. This method utilizes a chemical vapor deposition process and directs a silicon containing stream, such as silane or dichlorosilane, indicated by arrows 901, onto the surface of the structure. The amorphous silicon layer is used because when deposited it forms a more uniform thickness over (1) dislocation defects such as those indicated at 702, as indicated at 902, (2) will be more likely to form a layer of amorphous silicon, indicated at 904, over the particle 704 without regard to the makeup of the particle 704, and (3) will form a more uniform layer of amorphous silicon, indicated at 906, over the pit 706.

Figure 9A:
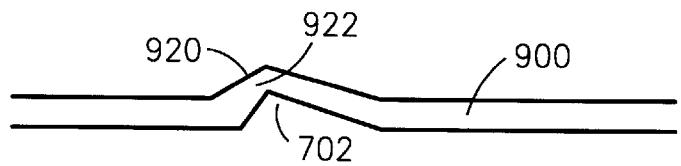
FIG. 9A shows an enlarged view of the first type of anomaly shown in FIG. 9 with a layer of amorphous silicon formed thereon as shown in the prior art.
Figure 9B:
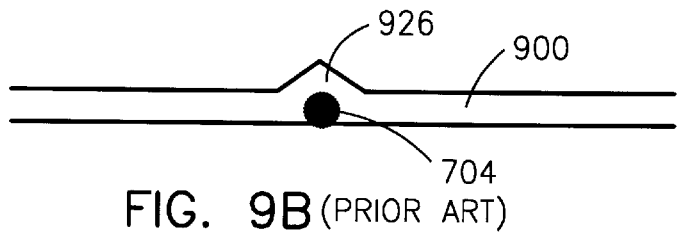
FIG. 9B shows an enlarged view of the second type of anomaly shown in FIG. 9 with a layer of amorphous silicon formed thereon as shown in the prior art.
Figure 9C:
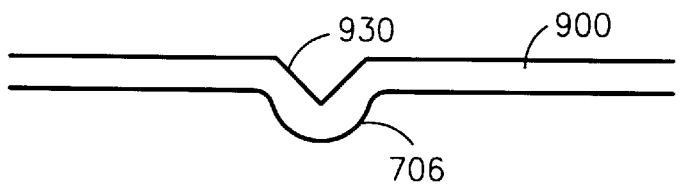
FIG. 9C shows an enlarged view of the third type of anomaly shown in FIG. 9 with a layer of amorphous silicon formed thereon as shown in the prior art.
Figure 9D:
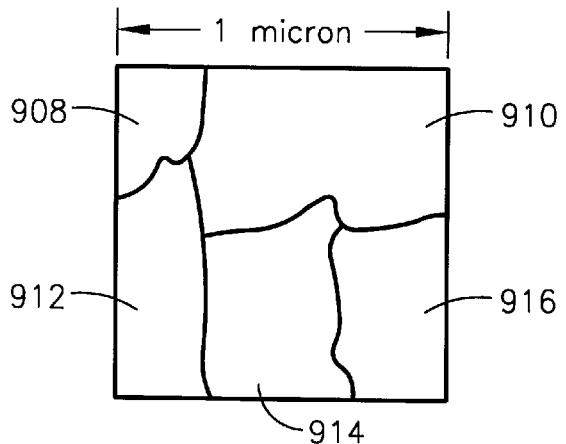
FIG. 9D shows the grain size of the amorphous silicon that is formed during crystallization in the method as shown in the prior art.

However, there are problems associated with this method of forming amorphous silicon. The deposition process necessary to obtain amorphous silicon utilizing silane must be done at a temperature of less than or equal to about 580° C. The problem occurs in subsequent processing in which the thin amorphous silicon film is oxidized completely in order to obtain the silicon oxide gate material. As the silicon oxide is formed from the amorphous silicon, the amorphous silicon crystallizes. The grain sizes of the amorphous silicon that is formed during the crystallization of the amorphous silicon is illustrated in FIG. 9D. The resulting grains are too large and the silicon oxide subsequently formed does not maintain conformality of the film over the raised and depressed defects caused by the anomalies discussed above. Representative grains are shown at 908 through 916. The large grain sizes negate one of the primary advantages of using the amorphous silicon. One of the reasons that the advantage of using amorphous silicon is negated is that the large grain size forms stress locations in the subsequently formed silicon oxide film that perpetuate some of the problems the amorphous silicon deposition was designed to solve. Referring to FIG. 9A there is shown an enlarged portion of the first type of anomaly 702 shown within dashed line 918 in FIG. 9. The layer of amorphous silicon 900 formed over the anomaly 702 will not result in a uniform layer of silicon oxide over the anomaly because of the large grains of amorphous silicon that form during the crystallization of the amorphous silicon as shown in FIG. 9D. There are nonuniform thicknesses, indicated at 922, over the anomaly 702 caused by the dislocation in the silicon substrate 100 as discussed above. FIG. 9B shows an enlarged portion of the second type of anomaly 704 shown within dashed line 924 in FIG. 9. The layer of amorphous silicon 900 formed over the anomaly 704 will not result in a uniform layer of silicon oxide over the anomaly because of the large grains of amorphous silicon that form during the crystallization of the amorphous silicon as shown in FIG. 9D. Because of the large grain size of the amorphous silicon the resulting silicon oxide layer will have a nonuniform thicknesses as shown at 926. FIG. 9C shows an enlarged portion of the third type of anomaly 706 shown within dashed line 928 in FIG. 9. The layer of amorphous silicon 900 formed over the anomaly 706 will not result in a uniform layer of silicon oxide, as indicated at 930, over the anomaly because of the large grains of amorphous silicon as shown in FIG. 9D.

Figure 10:
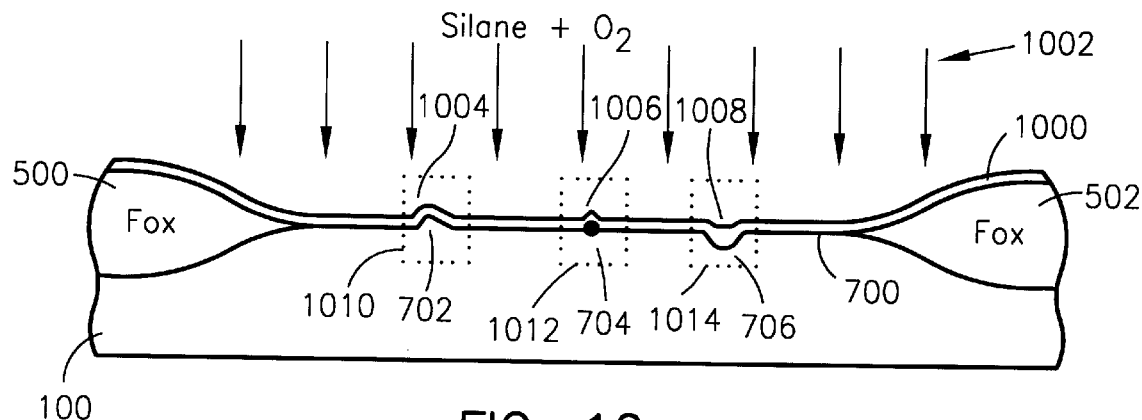
FIG. 10 shows the surface of the silicon substrate shown in FIG. 7 having an amorphous silicon layer formed by injecting oxygen into the silicon containing stream on the surface of the silicon substrate over the anomalies on the surface of the silicon substrate.
Figure 10A:
FIG. 10A shows an enlarged view of the first type of anomaly shown in FIG. 10 with a layer of amorphous silicon formed as in the present invention.
Figure 10B:
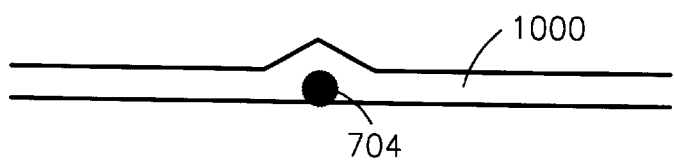
FIG. 10B shows an enlarged view of the second type of anomaly shown in FIG. 10 with a layer of amorphous silicon formed as in the present invention.
Figure 10C:
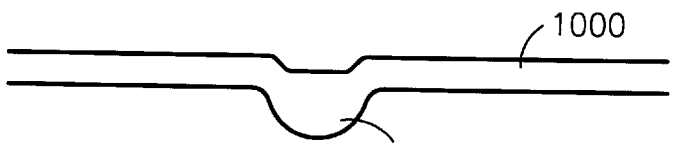
FIG. 10C shows an enlarged view of the third type of anomaly shown in FIG. 10 with a layer of amorphous silicon formed as in the present invention.
Figure 10D:
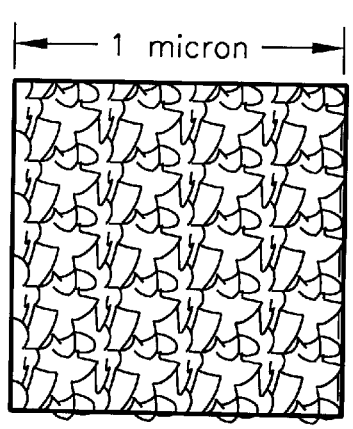
FIG. 10D shows the grain size of the amorphous silicon that is formed during crystallization in the method of the present invention.

Referring to FIG. 10, a method to solve the above problem is illustrated. This method involves depositing a layer of oxygen doped amorphous silicon, indicated at 1000, on the surface 700 of the silicon substrate 100. The thickness of the deposited oxygen doped amorphous silicon layer can be less than 5 nanometers. The resulting oxide layer can have a thickness of less than 10 nanometers. This method utilizes a chemical vapor deposition process and directs a silicon containing stream, such as silane or dichlorosilane, indicated by arrows 1002 at the surface 700. An oxygen containing gas, such as oxygen or an oxide of nitrogen, such as nitrous oxide, is injected into the silicon containing stream. The concentration of oxygen injected into the silicon containing stream is on the order of parts per thousand and the concentration is such that silicon oxide is not formed in any consequential concentration during the deposition. The oxygen doped amorphous silicon will result in a more uniform thickness of the silicon oxide layer formed over (1) dislocation defects, such as those indicated at 702, as indicated at 1004, (2) will be more likely to result in the actual formation of a layer of silicon oxide, indicated at 1006, over the particle 704 without regard to the makeup of the particle 704, and (3) will result in a more uniform layer of silicon oxide, indicated at 1008, over the pit 706. FIG. 10D illustrates the effect that injection of oxygen into the silicon containing stream has on the size of the amorphous silicon grains during the crystallization process and any other subsequent process. The much smaller grain size in the amorphous silicon results in a more uniform layer of silicon oxide over the raised and depressed defects caused by the anomalies as discussed above. Referring to FIG. 10A, an enlarged portion of the first type of anomaly 702 is shown within dashed line 1010. The layer of oxygen containing amorphous silicon 1000 formed over the anomaly 702 results in a more uniform layer of silicon oxide over the anomaly 702 because of the smaller grain size of amorphous silicon that forms during the crystallization of the amorphous silicon as shown in FIG. 10D. FIG. 10B shows the second type of anomaly 704 shown within dashed line 1012 in FIG. 10. The layer of oxygen containing amorphous silicon 1000 formed over the anomaly 704 results in a more uniform layer of silicon oxide over the anomaly because of the smaller grain size of amorphous silicon that will form during the crystallization of the amorphous silicon as shown in FIG. 10D. FIG. 10C shows an enlarged portion of the third type of anomaly 706 shown within dashed line 1014 in FIG. 10. The layer of oxygen containing amorphous silicon 1000 formed over the anomaly 706 results in a more uniform layer of silicon oxide over the anomaly because of the smaller grain size of the amorphous silicon that will form during the crystallization of the amorphous silicon as shown in FIG. 10D. The more uniform layer of silicon oxide that results from the smaller grain size of the amorphous silicon allows for an ultrathin oxide layer that can have a thickness of less than 10 nanometers.

Figure 11:
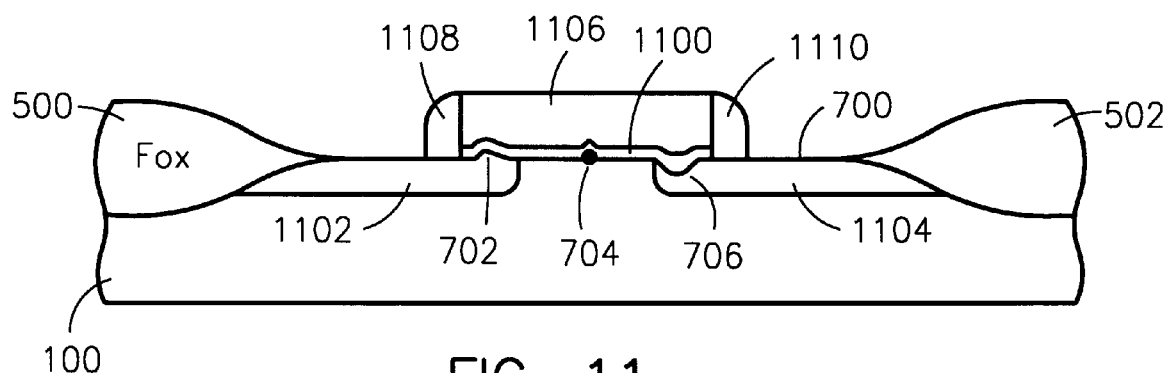
FIG. 11 shows a partially completed MOSFET device showing, for illustrative purposes, all three types of anomalies discussed herein.

Referring to FIG. 11 there is shown a partially completed MOSFET device. The gate oxide 1100 is formed from the amorphous silicon layer 1000 (FIG. 10). Also shown, for illustrative purposes, are all three types of anomalies discussed above, the first type of anomaly 702, the second type of anomaly 704, and the third type of anomaly 706. As can be appreciated, it is not probable that all three types of anomalies would be present. A source region 1102 and a drain region 1104 are formed by any conventional method known in the semiconductor manufacturing art. A gate 1106 is formed by methods known in the art with spacers 1108 and 1110 formed on either side of gate 1106. It is anticipated that the method as taught by the present application will be applicable to devices other than the MOSFET described above.

The foregoing description of the preferred embodiment of the invention has been presented for purposes of illustration and description. It is not intended to be exhaustive or to limit the invention to the precise form disclosed. A person of ordinary skill in the art will recognize that obvious modifications or variations are possible in light of the above teachings. The embodiment was chosen and described to provide the best illustration of the principles of the invention and its practical application to thereby enable one of ordinary skill in the art to utilize the invention in various embodiments and with various modifications which are suited to the particular use contemplated. All such modifications and variations are within the scope of the invention as determined by the appended claims when interpreted in accordance with the breadth to which they are fairly, legally, and equitably entitled.

What I claim is:

1. A method of manufacturing a semiconductor device, the method comprising:

forming a layer of oxygen doped amorphous silicon directly on a portion of a surface of a silicon substrate that will be the gate region of the semiconductor device, wherein the oxygen doped amorphous silicon is formed by injecting an oxygen containing gas into a silicon containing stream directed at the surface of the silicon substrate, wherein the oxygen containing gas is injected into the silicon containing stream with a concentration that substantially avoids the formation of silicon oxide in the layer of oxygen doped amorphous silicon during the deposition of the oxygen doped amorphous silicon and wherein the layer of oxygen doped amorphous silicon has a thickness of less than 5 nanometers; and oxidizing the amorphous silicon to form a layer of silicon oxide having a thickness of less than 10 nanometers.

2. The method of claim 1 wherein the oxygen containing gas is injected into the silicon containing stream with a concentration on the order of parts per thousand.

3. The method of claim 2, wherein the oxidizing the amorphous silicon is accomplished by forming a layer of silicon oxide in an ambient atmosphere containing oxygen.

4. The method of claim 2, wherein the oxidizing amorphous silicon is accomplished by forming a layer of silicon oxide in an ambient atmosphere containing an oxide of nitrogen.

* * * * *